(12) United States Patent
Quevy (10) Patent No.: US 8,878,528 B2
(45) Date of Patent: Nov. 4, 2014

(54) MEMS-BASED MAGNETIC SENSOR WITH A LORENTZ FORCE ACTUATOR USED AS FORCE FEEDBACK

(75) Inventor: Emmanuel P. Quevy, El Cerrito, CA (US)

(73) Assignee: Silicon Laboratories Inc., Austin, TX (US)

( * ) Notice: Subject to any disclaimer, the term of this patent is extended or adjusted under 35 U.S.C. 154(b) by 507 days.

(21) Appl. No.: 13/174,417

(22) Filed: Jun. 30, 2011

(65) Prior Publication Data

US 2013/0002244 A1 Jan. 3, 2013

(51) Int. Cl.
*G01R 33/02* (2006.01)
*G01R 33/028* (2006.01)

(52) U.S. Cl.
CPC .................................. *G01R 33/0286* (2013.01)
USPC ........................................................ 324/244

(58) Field of Classification Search
None
See application file for complete search history.

(56) References Cited

U.S. PATENT DOCUMENTS 6,822,929 B1 * 11/2004 Schubert et al. .............. 367/181

OTHER PUBLICATIONS

3-Axis Electronic Compass AK8975/B Datasheet, Asahi Kasei Microdevices Corp., 2 pp., URL: <http://www.asahi-kasei.co.jp/akm/en/product/ak8975b/ak8975b.html> downloaded Oct. 2011.

Bahreyni, Behraad, "A Resonant Micromachined Magnetic Field Sensor," IEEE Sensors Journal, vol. 7, No. 9, pp. 1326-1334, Sep. 2007.
Brugger, Simon and Paul, Oliver, "Field-Concentrator-Based Resonant Magnetic Sensor with Integrated Planar Coils," Journal of Microelectromechanical Systems, vol. 18, No. 6, pp. 1432-1443, Dec. 2009.
Emmerich, Harald and Schofthaler, Martin, "Magnetic Field Measurements with a Novel Surface Micromachined Magnetic-Field Sensor," IEEE Transactions on Electron Devices, vol. 47, No. 5, pp. 972-977, May 2000.
Eyre, Beverley and Pister, Kristofer S. J., "Micromechanical Resonant Magnetic Sensor in Standard CMOS," 1997 IEEE International Conf. on Solid-State Sensors and Actuators, pp. 405-408, Jun. 16-19, 1997.
Freescale, "Three-Axis, Digital Magnetometer," MAG3110, Freescale Semiconductor, Inc., rev. 2.0, 25 pp., Feb. 2011.
Herrera-May, Agustin L. et al., "Resonant Magnetic Field Sensors Based on MEMS Technology," Sensors 2009, 9, pp. 7785-7813, www.mdpi.com/journal/sensors, Sep. 30, 2009.
Izham, Zaki et al., "Development of a Resonant Magnetometer," Nanotech 2003, vol. 1, www.nsti.org, ISBN 0-9728422-0-9, 4 pp., 2003.
Kadar, Zsolt et al., "Integrated Resonant Magnetic-Field Sensor," Sensors and Actuators A: Physical, vol. 41, issues 1-3, pp. 66-69, Apr. 1, 1994.
Ren, Dahai et al., "Design and Analyses of a MEMS Based Resonant Magnetometer," Sensors 2009, 9, pp. 6951-6966, www.mdpi.com/journal/sensors, Sep. 2, 2009.

(Continued)

*Primary Examiner* — Paresh Patel
(74) *Attorney, Agent, or Firm* — Abel Law Group, LLP (57) ABSTRACT

A magnetic sensor utilizes a MEMS device that has at least one vibrating member and at least one conductive path integral with the vibrating member so that a current flows along the vibrating member and in the presence of a magnetic field interaction of the magnetic field and the point charges in the current on the conductive path due to the Lorentz force causes a change in vibration of the vibrating member. That change can be used to provide a measure of the magnetic field.

29 Claims, 9 Drawing Sheets

(56) References Cited

OTHER PUBLICATIONS

Sunier, Robert et al., "Resonant Magnetic Field Sensor with Frequency Output," Journal of Microelectromechanical Systems, vol. 15, No. 5, pp. 1098-1107, Oct. 2006.

Thompson, Matthew J. and Horsley, David A., "Resonant MEMS Magnetometer with Capacitive Read-Out," IEEE Sensors 2009 Conference, pp. 992-995, Jan. 2009.

* cited by examiner

MEMS-BASED MAGNETIC SENSOR WITH A LORENTZ FORCE ACTUATOR USED AS FORCE FEEDBACK

BACKGROUND

1. Field of the Invention

Embodiments of the invention pertain to the field of Microelectromechanical Systems (MEMS) and more particularly to magnetic field sensing using MEMS.

2. Description of the Related Art

Magnetic sensors can be found in many applications across a wide range of industries. For example, magnetic sensors can be found in automotive, consumer, industrial, medical, and aerospace applications. The magnetic sensor may be used to determine the orientation of a device with respect to its environment. In consumer applications, they can be found as sensors to detect when devices (e.g., cell phones, laptop computers, doors, etc.) are opened or closed. In addition, cell phones incorporate magnetic sensors to provide an electronic compass and navigation capability to complement GPS tracking. A relatively wide bandwidth magnetic sensor can be combined with an accelerometer to make a gyroscope.

Many different approaches have been used to detect magnetic fields including giant magneto-resistance (GMR), Fluxgate, anisotropic magnetoresistance (AMR), and Hall effect sensors, which exploit the Hall effect. Only Hall, GMR, and AMR sensors are of interest because of their ability to be integrated with integrated circuits, which provides a small form factor. In Hall effect sensors, when a voltage is applied across a semiconductor material, charge carriers begin to flow. If a magnetic field is applied perpendicular to the semiconductor material, the current carriers deflect to the side because of the Lorentz force causing a charge to build up on one side of the material. That results in a voltage across the semiconductor material perpendicular to the current carrier flow. The resulting Hall voltage is a measure of the magnetic field.

While Hall effect sensors are widely used, they can be bulky, particularly if the magnetic field sensing in three axes is desirable. For example, the Hall sensor may include a plate that occupies considerable space and depending on the application, can often require a separate integrated circuit.

Accordingly, improved magnetic sensors that are small and efficient are desirable.

SUMMARY

Accordingly, in one embodiment, a magnetic sensor is provided that includes a MEMS device. The MEMS device includes a member configured to vibrate responsive to a drive force. At least one conductive path is integral with the member to allow a current to flow into and out of the resonating member and configured to exert a Lorentz force on the member when a current flows through the conductive path in the presence of a magnetic field having at least a portion of the magnetic field orthogonal to the conductive path. An apparent quality factor (Q) of the MEMS device is changed in the presence of the magnetic field acting on current flowing through the conductive path that creates the Lorentz force.

In another embodiment, a method of sensing a magnetic field using a MEMS device includes supplying a current to at least one conductive path integral with a resonator of a MEMS device to thereby exert a Lorentz force on the resonator in the presence of the magnetic field. The magnetic field is determined based on a control value in a control loop used to maintain the MEMS device in resonance.

BRIEF DESCRIPTION OF THE DRAWINGS

The present invention may be better understood, and its numerous objects, features, and advantages made apparent to those skilled in the art by referencing the accompanying drawings.

Note that the use of the same reference symbols in different drawings indicates similar or identical items.

DESCRIPTION OF THE PREFERRED EMBODIMENT(S)

Embodiments of the invention exploit Microelectromechanical Systems (MEMS) devices to sense magnetic fields. Before describing embodiments of the invention, some background information on MEMS devices is provided. "MEMS" generally refers to an apparatus incorporating some mechanical structure having dimensions, less than, e.g., approximately 100 or 200 μm. MEMS devices are commonly used for such applications as oscillators in timing applications, accelerometers, and inertial sensors, and the number of applications is growing. Certain structural components of a MEMS device are typically capable of some form of mechanical motion. The MEMS device can be formed using fabrication techniques similar to techniques used in the electronics industry such as Low Pressure Chemical Vapor Deposition, (LPCVD), Plasma Enhanced CVD (PECVD), patterning using photolithography, and Reactive Ion Etching (RIE), etc.

Figure 1:
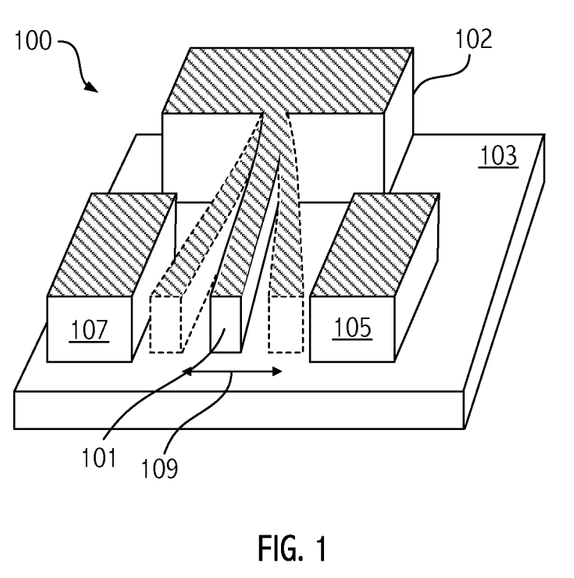
FIG. 1 illustrates a conventional MEMS resonator.

MEMs devices used in timing applications include a resonator. The resonator may have a variety of physical shapes, e.g., beams and plates. FIG. 1 illustrates a conventional resonating MEMS device 100 that has a resonating member 101 coupled to an anchor 102, which in turn is coupled to the substrate 103. The MEMS device includes electrodes 105 and 107 forming electrostatic transducers with the resonating member. One of the electrodes functions as a drive electrode and the other, a sense electrode. The electrodes are coupled to appropriate voltage levels provided through appropriate conductive paths in the substrate and the resonating member 101 is coupled to an appropriate voltage level through the anchor 102. During operation, a drive electrode 105 electrostatically drives resonator 101, using a voltage differential that exists between the drive electrode 105 and resonator 101, so that resonator 101 dynamically deflects as illustrated by arrow 109 in a plane parallel to the substrate 103. A sense electrode 107 detects a change in capacitance as the capacitance varies between resonator 101 and resonator 107 due to the "in-plane" motion of resonator 101. The capacitance sensed corresponds to the resonating frequency of the beam 101. An oscillator circuit (not shown) typically uses the output from the sense electrode and maintains the MEMS device at a resonant frequency using the drive electrode. As is well known in the art, other vibration modes such as out-of-plane or torsional modes exist for MEMS devices.

While the resonating MEMS device described in FIG. 1, by way of background, is suitable as a resonating MEMS device, various types of MEMS devices can be adapted for use as magnetic sensors. Various embodiments of the invention exploit the interaction of magnetic fields on point charges. The Lorentz force describes the well-known relationship of the force on a point charge due to electromagnetic fields. Generally, the Lorentz force $F=q[E+(v \times B)]$, where the vector E is the electric field, the vector B is the magnetic field, q the electric change, v is the velocity of the charged particle and × is the cross product. For just the magnetic force component, $F_{mag}=q(v \times B)$. It is that relationship that can be exploited to utilize a MEMS device as a magnetic field sensor.

Figure 2A:
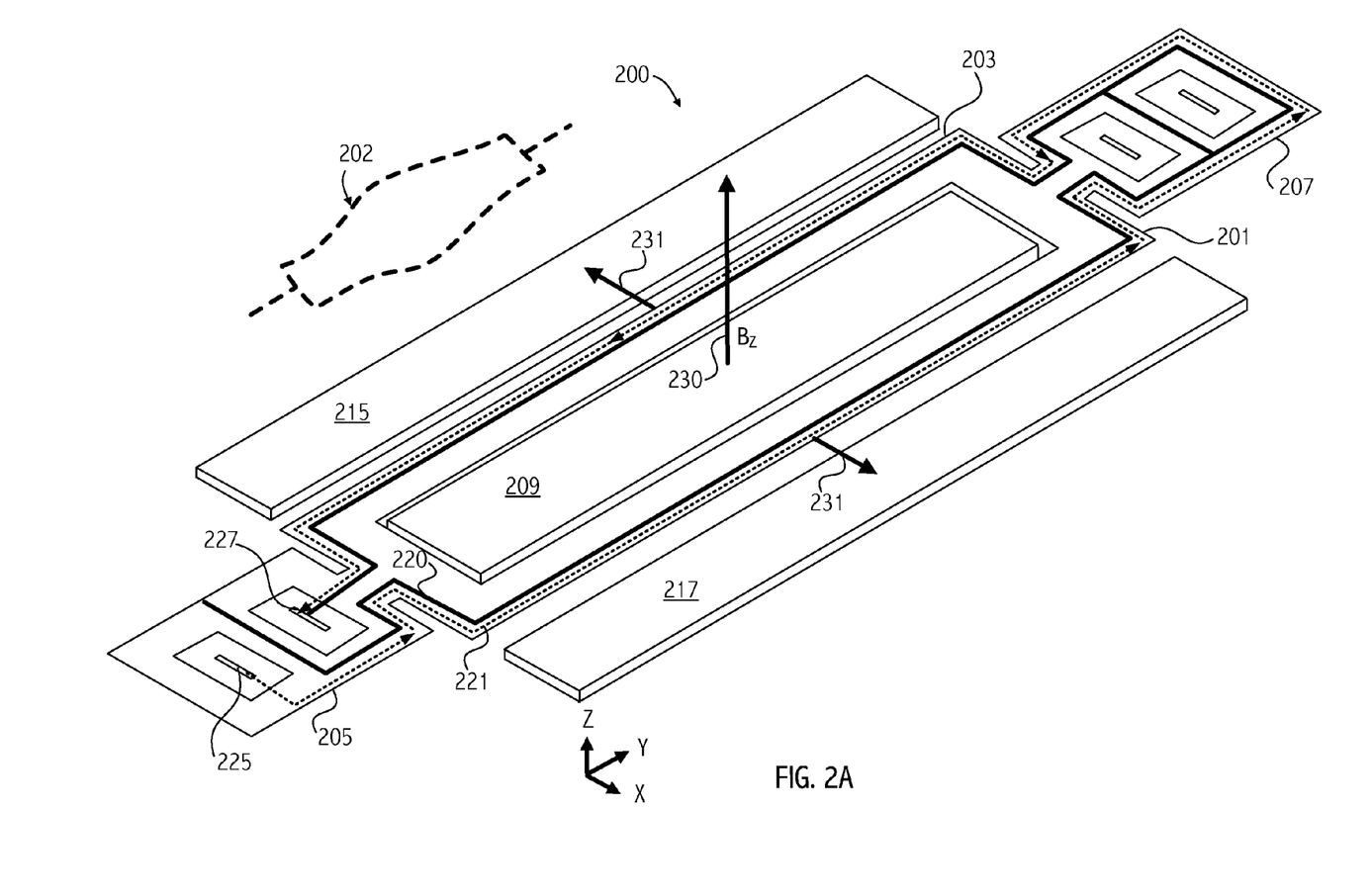
FIG. 2A illustrates a tuning fork MEMS device according to an embodiment of the invention.

Referring to FIG. 2A, illustrated is an exemplary embodiment of the device. The illustrated embodiment is a resonating MEMS device using input electrostatic transducers (parallel plates with the drive or sense electrode as one plate and the vibrating member as the other plate) to cause the tuning fork members or tines to vibrate due to the electrostatic force formed between the plates being converted to a mechanical force. The electrostatic force causes the tines of the tuning fork to vibrate and given the appropriate electrical signal, to place the MEMS device into resonance. Output electrostatic transducers convert the vibration of the MEMS device to an electrical signal and that output is supplied to an oscillator circuit to keep the MEMS device resonating. FIG. 2 illustrates an exemplary double-ended tuning fork MEMS device 200 that includes the resonating tuning fork members 201 and 203 tied to anchors 205 and 207, which are in turn tied to the substrate below (not shown). The tuning fork may be formed of silicon germanium (SiGe) or other appropriate materials. Charge on the drive electrode 209 causes the tuning fork tines to vibrate in-plane in the manner described by the dotted lines shown at 202. The drive electrode is coupled to appropriate voltage levels through interconnections to a voltage value supplied by the oscillator circuit. Output electrostatic transducers utilize sense electrodes 215 and 217 to sense the vibration to supply an electrical signal corresponding to the mechanical motion, to an oscillator circuit described later herein to maintain the MEMS device resonating.

In addition to the tuning fork MEMS configuration, as shown in FIG. 2A, a magnetic sensor according to an embodiment of the invention includes a conductive path formed on the tuning fork so a current 221 (shown as a dotted line) can flow along the tuning fork. The conductive path is formed using an oxide or other isolation layer 220 to isolate a portion of the tuning fork so as to form a conductive path. The conductive path is integral with the vibrating members (tines) of the tuning fork. In the particular illustrated embodiment, the conductive path is formed of the same material as the tuning fork, but in other embodiments it may be formed of a different material. However formed, the conductive path is integral with the vibrating member such that any force exerted on the current flowing along the conductive path is imparted to the vibrating member to affect its motion.

In the exemplary embodiment shown, the current enters the conductive path at 225 in the anchor 205, which is tied through an interconnect to a current supply described later herein. In the illustrated embodiment, the current flows along the edge of the tuning fork as shown by the dotted line 221, around the anchor 207 and along the edge of the other side of the tuning fork and exits through the anchor 205 at an interconnect 227 to a low impedance node such as ground. In the example shown, the current path is on the edge of the tuning fork. In other embodiments, isolation layers may be used to form a current path in the tuning fork that is isolated from the edge of the tuning fork and therefore interacts with the electrostatic drive and sense electrodes less than the illustrated embodiment. Note that while a single current path is shown, multiple current paths can in fact be formed on the tuning fork with appropriately formed isolation material to create the current paths to route the current. Additional isolation layers may be utilized in the embodiment shown in FIG. 2 to maintain the tuning fork tines at appropriate potentials. Note that the current path along the length of the tuning fork tines are perpendicular to the direction of vibration.

When the tuning fork resonator shown in FIG. 2A is in the presence of a magnetic field $B_Z$ 230 perpendicular to both the direction of current flow and vibration of the MEMS device, an additional force is imparted on the vibrating tuning fork due to the Lorentz force interacting with the point charges of the current thereby causing the vibration of the tuning fork to change, which change will be sensed by the output transducer. Assuming the magnetic field $B_Z$ 230 in the Z axis direction, the Lorentz force is the cross product as stated above. The magnetic field is along the Z axis, the current flows along the Y axis, and the tines vibrate along the X axis. The Lorentz force therefore exerts a force illustrated by arrows 231 on the current flowing in the conductive path of the resonator. That force increases vibration of the tuning fork. The amount of increased vibration is dependent on factors such as the strength of the magnetic field, the current, and the number of current paths in the resonator. Given a magnetic field such as the earth's magnetic field, sufficient force will be imparted to affect resonator motion and thereby detect the field.

Figure 2B:
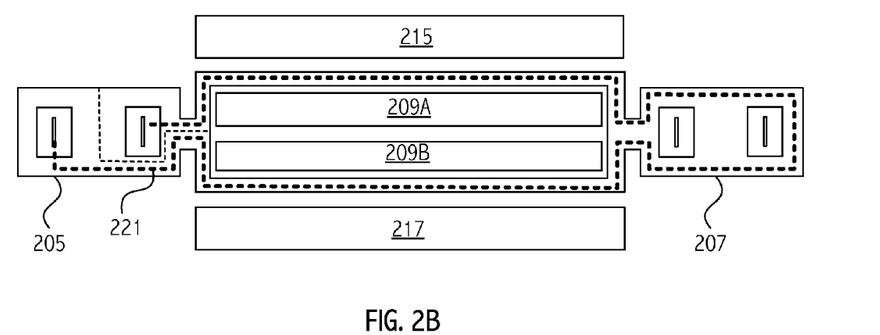
FIG. 2B illustrates a top view of a tuning fork MEMS magnetic sensor according to an embodiment of the invention.

FIG. 2B illustrates a top view of a tuning fork MEMS resonator in which a current path is integral with a resonating member. FIG. 2B includes separately identified drive electrodes 209A and 209B.

Figure 3:
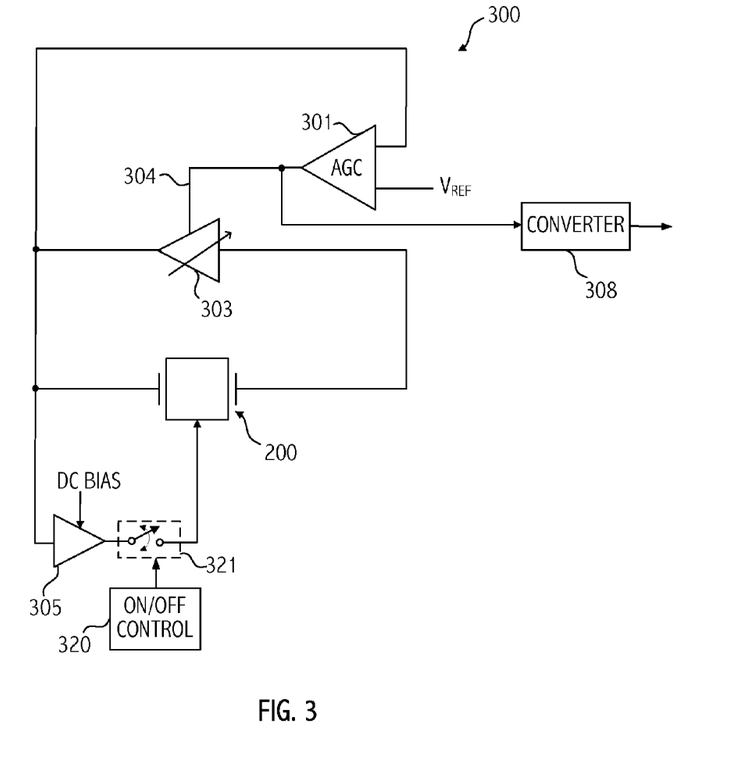
FIG. 3 illustrates an oscillator including a MEMS device with a Lorentz force actuator.

In an embodiment of the invention, the illustrated MEMS device is utilized as part of an oscillator. The oscillator output is converted into a current modulated at the oscillator frequency that is fed back as the current flowing on the resonator, which is acted upon by the Lorentz force, thus providing a Lorentz force actuator. Referring to FIG. 3, illustrated is a high level diagram of an oscillator 300 incorporating the MEMS device 200. In the particular implementation shown in FIG. 3, an automatic gain control (AGC) circuit maintains the output of the oscillator constant. An amplifier 301 of the AGC loop receives a reference voltage $V_{REF}$, which is the set point of the AGC loop, and compares that voltage to the output of amplifier 303, which supplies the drive electrodes of the MEMS device. Amplifier 301 supplies the amplifier 303 with a control input on node 304 to adjust the output of the amplifier and thus the oscillator setting based on the comparison. In addition to supplying the drive electrodes, amplifier 303 supplies the amplifier 305, which in turn supplies the current that travels along the conductive path of the resonator. The Lorentz force, assuming the magnetic field described above that is orthogonal to the direction of current flow and to the direction of vibration, imparts a force on the electrons forming the current and thus affects the resonator. The control signal 304 of the AGC loop varies based on the strength of the magnetic field and is supplied to a converter 308 to convert by appropriate scaling the output of amplifier 304 to a signal representative of the magnetic field. Note that the magnetic field can also affect Q negatively, if the affects are 180 degrees out of phase with the drive signal. That would be reflected in an increase in the gain of the AGC loop, reflected in an increase in the value of signal 304.

The modulated current on the vibrating members in the presence of the magnetic field creates a force that is added back to the resonator and so affects the effective quality factor of the resonator. In effect, the Lorentz force actuator provides an additional feedback loop that feeds into the MEMS resonator. In the embodiment illustrated in FIGS. 2 and 3, the Lorentz force actuator adds an additional force for a given input stimuli coming from the circuit and so affects the quality factor of the device. That is, the motional parameters of the MEMS magnetic sensor device change due to the Lorentz force actuator, the apparent quality factor of the device increases, and it is easier to get a sustained oscillation for a given gain factor in the oscillator. The AGC loop reacts to that and lowers the actual gain in the feedback loop to maintain the same oscillation. The change in gain of the feedback loop provides an indirect measurement of the ambient magnetic field and thus the MEMS devices shown in FIGS. 2 and 3 can function as a magnetic sensor.

The sensor solution described herein provides improvement over readout techniques that use capacitive modulation at either low frequency, which means low sensitivity, or at resonance, which means low bandwidth for high sensitivity. The sensor solution described herein combines the best of both. The oscillator keeps the resonator at resonance, which allows generation of a Lorentz-based signal at resonance and provides benefit from the Q factor. The bandwidth of the detectable signal (change of magnetic field as a function of frequency) is set by the loop dynamics of the AGC loop. Thus, the bandwidth of the magnetic sensor transfer function for the sensor device, including the MEMS device and circuit to support oscillation, is determined by the poles and zeros of the AGC loop. That provides the advantage of not being limited by Q of the MEMS device as are gyroscopes or accelerometers and does not force operation below resonance as is necessary in capacitive readout circuits.

Figure 4A:
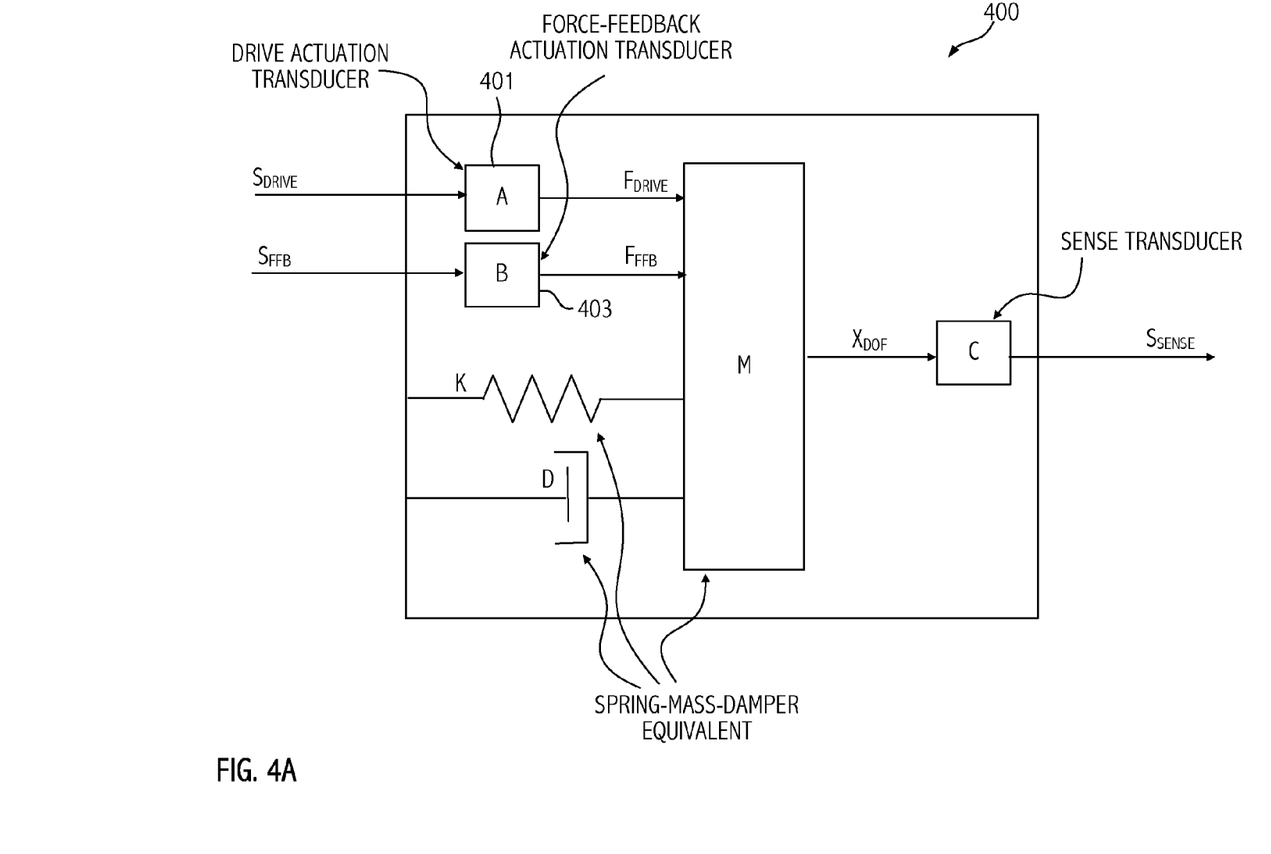
FIG. 4A illustrates a high level block diagram of aspects of a magnetic sensor according to an embodiment.

Referring to FIG. 4A, illustrated is a block diagram of a MEMS magnetic sensor according to an embodiment of the invention from the perspective of representing the MEMS device 400 as a spring-mass-damper equivalent where K is the equivalent stiffness, D is equivalent damping and M is equivalent mass. The MEMS sensor 400 includes a drive actuation transducer 401 and a force feedback signal transducer 403. A mechanical force $F_{drive}$ results from the drive signal $S_{drive}$ being applied to the drive transducer 401. A mechanical force $F_{FFB}$ results from the force feedback signal $S_{FFB}$ being applied to the force-feedback transducer 403. The movement of the mass M as a result of the mechanical forces results in a displacement $X_{DOF}$ along an axis defined by the mechanical degree of freedom which is aligned with the actuation force axis using MEMS device 400 in which a Lorentz force actuator 401 is used in place of an input electrostatic transducer. Note that the actuators 401 and 403 can be swapped in the sense that either can be a drive or feedback transducer.

Figure 4B:
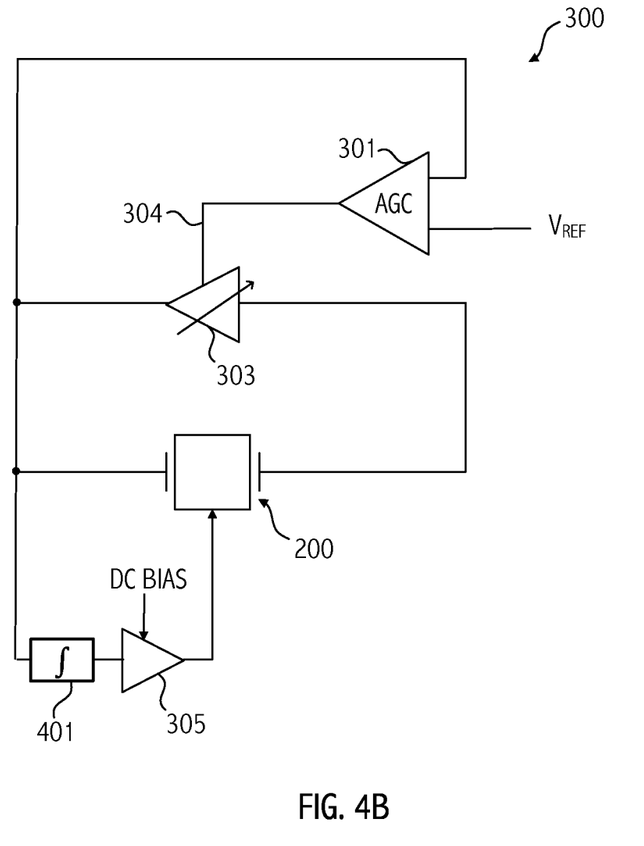
FIG. 4B illustrates an oscillator according to an embodiment of the invention.

If the Lorentz force is used as a drive transducer, a current is input to a current path on the vibrating members of the MEMS device and in the presence of a magnetic field, a force is generated that varies according to the strength of the magnetic field. Thus, transducer 401 can be a drive transducer augmented by the Lorentz force transducer 403. In such an embodiment, rather than affecting the quality factor of a resonator, the magnetic force affects the transducer efficiency:

$$Rx = \frac{\sqrt{K_r M_r}}{Q n_i n_o},$$

where $R_x$ is the motional resistance and $K_r$ is the equivalent stiffness, $M_r$ is the equivalent mass, Q is the quality factor and $n_i$ and $n_o$ are, respectively, the input efficiency and the output efficiency. Instead of having a parallel plate capacitor having a charge that varies to cause a vibration of the vibrating members, a Lorentz force provides input to cause vibration. The size of the ambient magnetic field and the current on the vibrating member affect the input transducer efficiency. However, it is similar to moving the quality factor because increasing the quality factor or the input transducer efficiency can be seen as reducing motional resistance. The motional resistance moves as a function of the Lorentz force, which is a function of the ambient magnetic field and the configuration of the current paths along the vibrating members. FIG. 4B illustrates an embodiment that includes an integrator 401 that causes the drive actuators and the Lorentz force actuators to be in phase. If the drive and Lorentz force actuators are in phase, the Lorentz force actuator adds to the transducer characteristic. If 90 degrees apart, the Lorentz force actuator affects the Q.

Current flowing along a conductor causes heating. Thus, the temperature of the resonator will increase due to the current along the resonator used to sense the magnetic fields, causing a temperature gradient in the resonator. That can affect the quality factor of the resonator and thus the accuracy of the measurement of the magnetic field. In order to avoid temperature affecting the accuracy of the magnetic sensing, in an embodiment, a DC bias is included in the feedback current, for example, by adding a DC bias at amplifier 305 (see FIG. 3). That DC bias should be set so that the temperature of the resonator is set to a level that will not be significantly disturbed by the additional Lorentz force current and the temperature of the resonator will be maintained substantially constant. Note that the resistive path coming from the coil should be kept low (for example with low sheet resistance) to minimize the Joule effect and as a result, reduce or minimize the thermal increase coming from the current drive. Also, the thermal time constant should be very fast or very slow to make sure the settling of the oscillator due to thermal effect does not affect the bandwidth of the sensor.

In order to save power, in an embodiment, the current through the coil is applied with a duty cycle (switched on and off). For example, if it takes 20 ms for the oscillator to settle after the current is switched on, measurement could occur at a rate no higher than 50 Hz. Further, the measurements can be relative with respect to the AGC output 304 when the current is off and when the current is on. The values when the current is on and off may be stored in registers (not shown) and compared. The difference between the values when on and when off reflects the magnetic field. Referring to FIG. 3, the on/off control for the current may be implemented by on/off control block 310 controlling a switch 312 with an appropriate periodicity. The value of the output 304 reflects the presence or absence of the Lorentz force as less amplification is need at amplifier 303 when the Lorentz force is present.

Figure 5A:
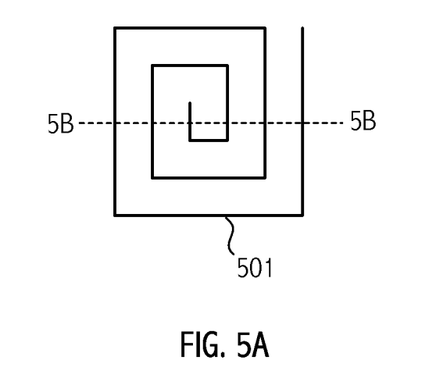
FIG. 5A illustrates a top view of an inductor that may be used to calibrate the MEMS magnetic sensor.
Figure 5B:
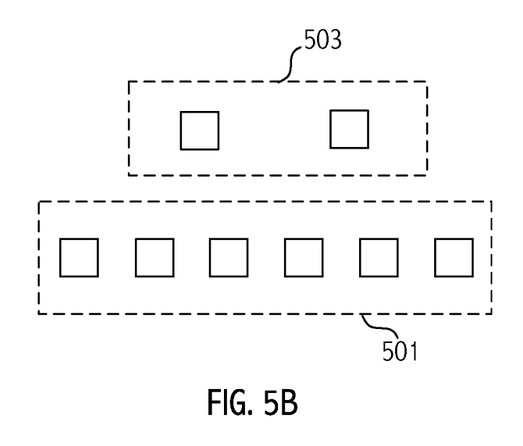
FIG. 5B illustrates a cross-sectional view of an inductor and a tuning fork MEMS device configured as a magnetic sensor to be calibrated using the inductor.

In an embodiment, the MEMS device is built above CMOS circuitry, such as the ACG loop. Referring to FIG. 5A, in an embodiment, an inductor 501 is additionally formed, e.g., in one of the metal layers of the integrated circuit below a MEMS magnetic sensing device. FIG. 5B shows a cross-sectional view of the inductor 501 with a tuning fork MEMS device 503 disposed above the inductor. That inductor can be used to calibrate the magnetic sensor. For example, a known current is supplied to the inductor. That creates a known magnetic field for the magnetic sensor, whose output can then be calibrated to the known magnetic field. In addition, the current supplied to the inductor can be varied so the magnetic sensor can be calibrated across multiple magnetic field strengths. Additionally, multiple inductors in various configurations can be used to generate the desired magnetic field.

Figure 6:
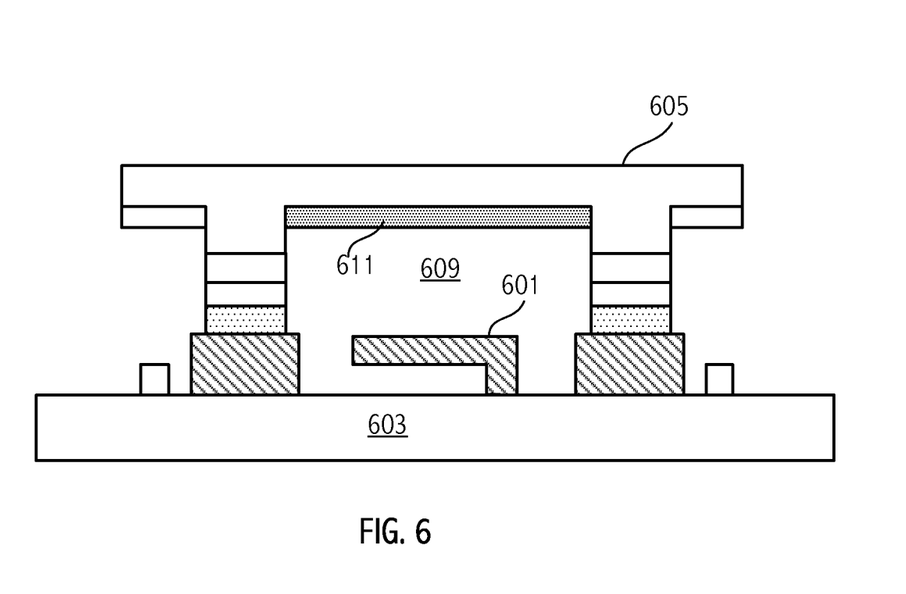
FIG. 6 illustrates the use of permalloy material to improve the magnetic field sensing.

In an embodiment, in order to improve the operation of the magnetic sensor, magnetic concentration material may be incorporated that concentrates the magnetic field lines to be sensed. The MEMS devices utilized for the magnetic sensor are typically encapsulated in a vacuum (or other atmosphere) and may use a bonded cap wafer as described in U.S. application Ser. No. 12/124,043, filed May 20, 2008, entitled "Encapsulated MEMS Device and Method to Form the Same," which application is incorporated by reference herein. As shown in FIG. 6, a MEMS device 601 formed on a substrate 603 is encapsulated with a cap wafer 605 that forms an interior sealed cavity 609. As part of that process of bonding the cap wafer, permalloy magnetic field concentrator material 611 is added to the cap wafer as shown in FIG. 6. The material, e.g., NiFe, can be incorporated during the cap wafer processing by sputter deposition. The layer can be unpatterned or shadow masking may be used to define a certain pattern to the material. Concentrators have gain capability by concentrating magnetic flux lines, which can improve the stimulus that is being sensed. Another advantage of the layer is that it performs a local field deflection in the vicinity of the concentrator to allow for multi-axis detection with a combination of single axis sensors appropriately located.

Figure 7:
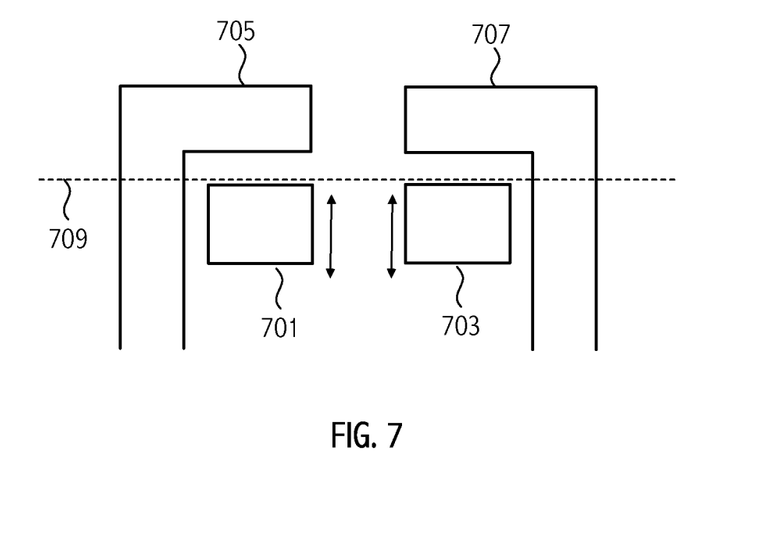
FIG. 7 illustrates a cross-sectional view of electrodes vertically disposed from the resonating member of the MEMs device.

While FIGS. 2A, 2B show an embodiment in which the MEMS device vibrates in-plane and senses a magnetic field in the Z direction, many other configurations for MEMS devices can be used and multiple dimensions (X, Y, and/or Z) can be sensed. For example, MEMS devices can be built that vibrate out-of-plane. In that way, magnetic fields that are in the X and Y direction can be sensed depending on the orientation of the sensor. For example, the tuning fork MEMS devices can be fabricated with electrodes above, and/or below the tines of the tuning fork. For example, FIG. 7 illustrates a cross-section of a tuning fork MEMS device with tines 701 and 703. Electrodes 705 and 707 are formed above the tuning fork tines. Note that electrodes could also be formed below the vibrating members. A magnetic field in the X direction (see FIG. 2) in plane 709 with the tines, assuming the current runs in the direction shown in FIG. 2 on the tuning fork resonator, results in a vertical force on the tuning fork members resulting in out-of-plane vibration. That vibration can be sensed by the electrostatic transducers formed by the electrodes 705 and 707 and the tuning fork tines.

Figure 8:
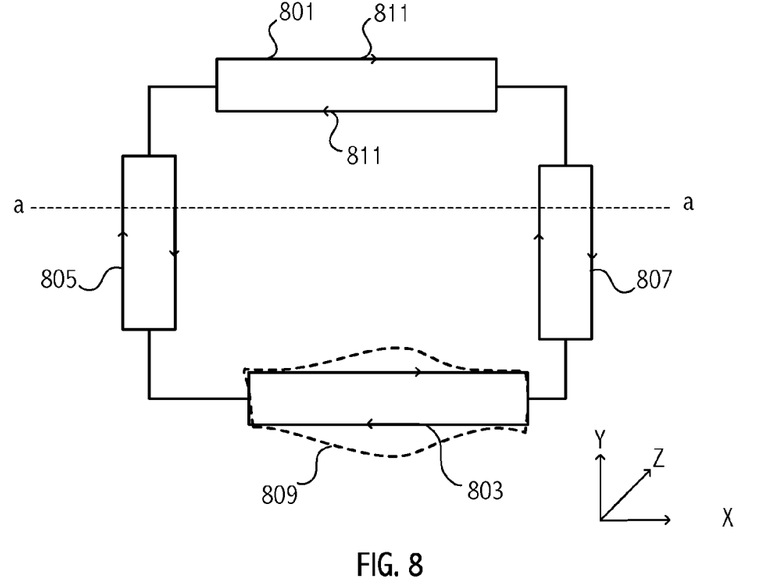
FIG. 8 illustrates a magnetic sensor according to an embodiment of the invention that can sense a magnetic field in three axes.

Referring to FIG. 8, another embodiment shows a top view of an embodiment having two pairs (801 and 803, 805 and 807) of parallel tuning forks. Each tuning fork may have its own oscillator circuit formed around the resonating tuning fork. Similar to the embodiment shown in FIG. 3, the change in gain caused by the magnetic field provides an indirect measurement of the magnetic field. The in-plane vibration 809 is shown for the tuning fork 803. The drive and sense electrodes for the in-plane vibration are not shown to simplify the diagram, but could be similar to those shown in FIGS. 2 and 3 The current is shown at 811 running in opposite directions on the tines of each tuning fork. For a magnetic field in the Z direction, perpendicular to the plane of the tuning forks, all four elements 801, 803, 805, and 807 contribute to the sensing of the field in that the vibration of each will be affected.

In addition to in-plane vibration, each tuning fork has an electrode disposed above each tine such as shown in FIG. 7 to form an output electrostatic transducer to sense out-of-plane vibration. Note that the electrode could also be below the tuning fork or one below and one above. Thus, the configuration can sense magnetic fields in the X and Y directions as well. For a magnetic field in the X direction, only those elements 805 and 807, having a current perpendicular to the magnetic field, contribute to the sensing of the magnetic field. For a magnetic field in the Y direction, only elements 801 and 803 contribute to the sensing of the magnetic field. Thus, the embodiment illustrated can sense current in X, Y, and Z directions. Of course, only two perpendicular elements (one of each pair) can be used to accomplish sensing in three directions.

Figure 9:
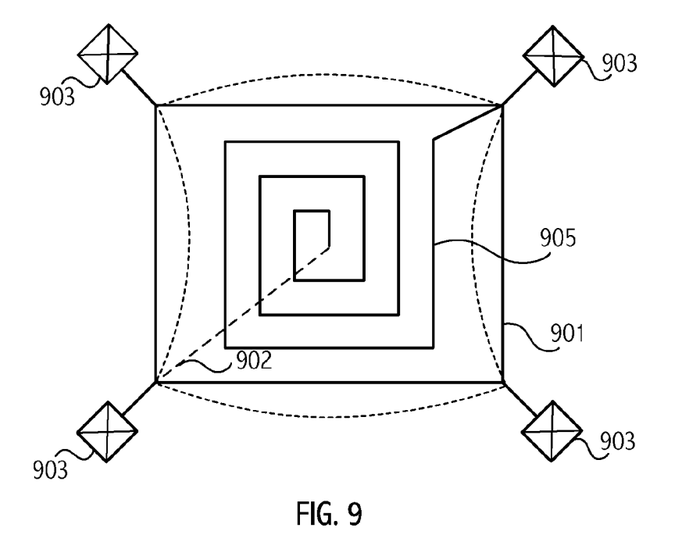
FIG. 9 illustrates a MEMS device that utilizes a plate with isochoric motion as part of a magnetic sensor.

Other types of MEMS devices may also be used. FIG. 9 illustrates a square plane resonator 901 having one or more anchors 903 and a coil 905. Current enters through one of the anchors and exits through the same or a different anchor (the exit path is illustrated by the dotted line 902 in FIG. 9) and may be through a conductive path in a portion of the square plate underneath or otherwise isolated from the coil 905. The resonator shown in FIG. 9 is known as a Lame mode resonator. When actuated from the side, the resonator has an isochoric (constant volume) motion as indicated by the dotted lines. That is, motion in one direction is offset by an opposite motion to maintain the volume of the plate. Sense electrodes (not shown) sense the motion of the plate. The Lorentz force affects the motion of the plate due to the interaction of the ambient magnetic field on current flowing through the conductive paths. The conductive paths are formed by putting suitable isolation layers to allow the conductive paths to be formed on the plate. The plate may be formed of silicon germanium or other suitable material.

Figure 10:
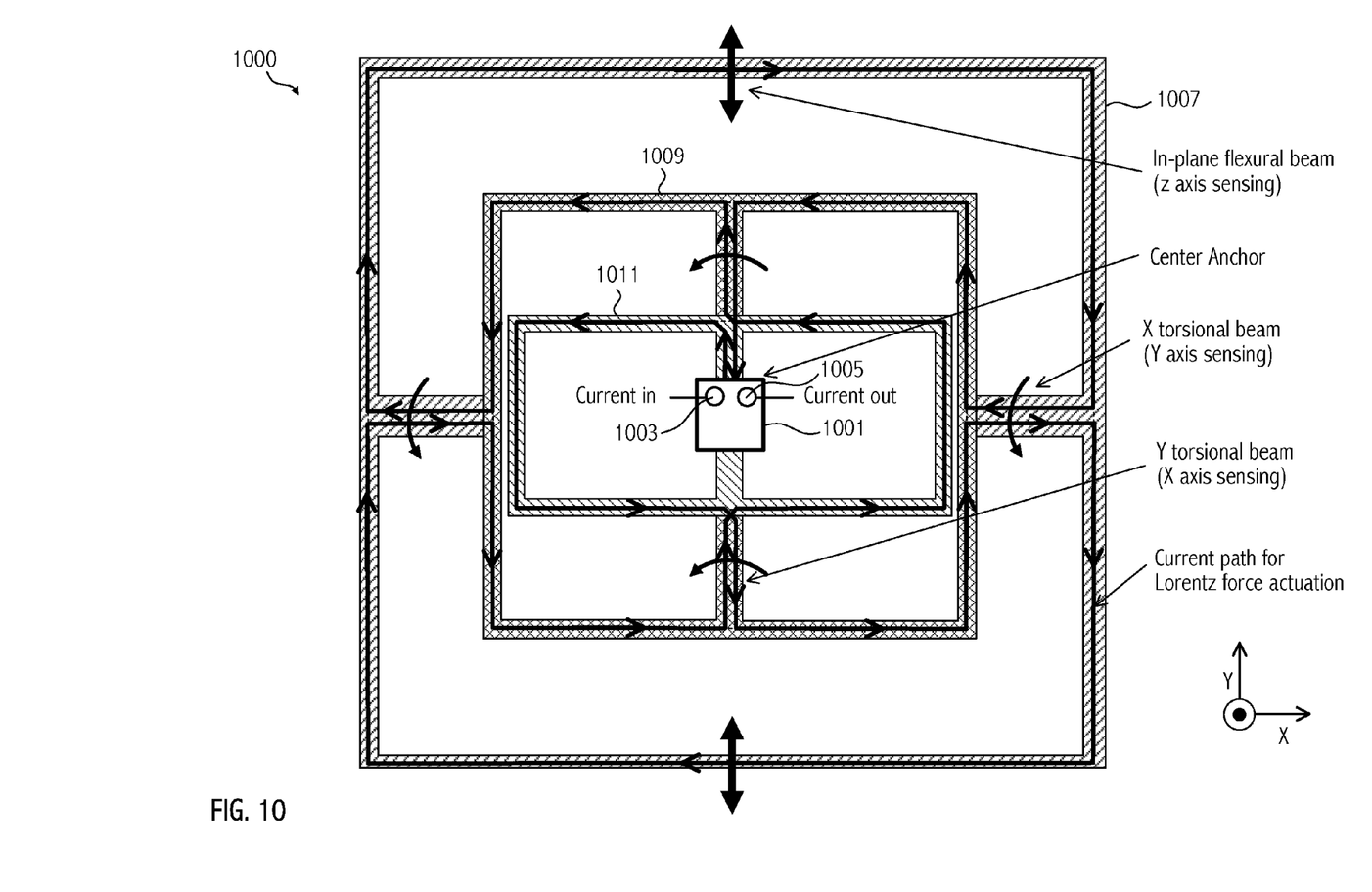
FIG. 10 illustrates a top view of an exemplary MEMS device that can sense magnetic fields in multiple axes.

Referring to FIG. 10, illustrated is a single gimbaled frame device 1000 combining all three axes to be sensed in one mechanical device and one coil. The embodiment provides advantages of smaller size as compared to having separate devices for each axis. A center anchor 1001 provides a current in location 1003 and a current out location 1005 for the current loop as well as anchoring for the three degrees of freedom device. The frame 1007 provides in-plane flexural beam for sensing a magnetic field in the Z axis. The frame 1009 provides torsional beam with rotation around the X axis for sensing a magnetic field in the Y axis. The frame 1011 provides a torsional beam with rotation around the Y axis for sensing a magnetic field in the X axis. Note also that a single current loop is utilized, which allows using one third of the current as compared to driving each axis separately. The relative alignment of each axis with one another is also very accurate because it is defined by layout and semiconductor processing.

The description of the invention set forth herein is illustrative, and is not intended to limit the scope of the invention as set forth in the following claims. Other variations and modifications of the embodiments disclosed herein may be made based on the description set forth herein, without departing from the scope and spirit of the invention as set forth in the following claims.

What is claimed is:

1. A magnetic sensor comprising:
a MEMS device including,
a member configured to vibrate responsive to a drive force;
at least one conductive path integral with the member to allow a current to flow into and out of the member and configured to exert a Lorentz force on the member when a current flows through the conductive path in the presence of a magnetic field having at least a portion of the magnetic field orthogonal to the conductive path;
wherein an apparent quality factor (Q) of the MEMS device is changed in the presence of the magnetic field acting on the current flowing through the conductive path that creates the Lorentz force;
an oscillator including the MEMS device, the oscillator including a control loop to maintain output of the oscillator constant and wherein a value of the magnetic field is reflected in a control signal of the control loop used to maintain the output constant.

2. The magnetic sensor as recited in claim 1, wherein a difference in required force applied by a drive actuation transducer to maintain the MEMS device in resonance is indicative of the magnetic field.

3. The magnetic sensor as recited in claim 1 wherein the conductive path is coupled to receive a current based on a sensed output of the MEMS device.

4. The magnetic sensor as recited in claim 1 wherein at least a portion of the conductive path is oriented such that current that flows through the portion is perpendicular to a direction of vibration of the member.

5. The magnetic sensor as recited in claim 1 wherein an output of the oscillator is converted into a feedback current modulated at a frequency of the oscillator and is fed back into the conductive path.

6. The magnetic sensor as recited in claim 1 wherein the control loop is configured to maintain a maximum displacement of the member at resonance at a constant value.

7. The magnetic sensor as recited in claim 1 further comprising an inductor formed in a metal layer of the integrated circuit, the inductor selectively coupled to a current source so as to provide a magnetic field for calibrating the magnetic sensor.

8. The magnetic sensor as recited in claim 1 further comprising magnetic concentration material formed in a sealed environment for the MEMS device.

9. The magnetic sensor as recited in claim 1 further comprising at least one input electrostatic transducer to drive the member and at least one output electrostatic transducer to sense vibration of the member.

10. The magnetic sensor as recited in claim 1 wherein the member is configured to vibrate in a direction that is at least one of in-plane and out-of-plane according to orientation of the magnetic field.

11. The magnetic sensor as recited in claim 1 wherein the MEMS device includes at least two coupled beams at right angles to each other, each beam configured to vibrate in-plane and out-of-plane, two of the beams vibrating in-plane in response to presence of the magnetic field when the magnetic field is orthogonal to a plane of the beams, at least one of the beams resonating out-of-plane in response to the magnetic field being in the plane of the beams and orthogonal to current flowing in the at least one beam.

12. The magnetic sensor as recited in claim 1 wherein the magnetic sensor senses a magnetic field in three dimensions.

13. The magnetic sensor as recited in claim 12 further comprising a single current path through the MEMS device to sense a magnetic field in all three dimensions using a single current flowing through the current path.

14. The magnetic sensor as recited in claim 1 further comprising a DC bias circuit supplying a DC component to the current supplied to the conductive path to maintain a temperature of the member at a level that is substantially undisturbed by the current supplied to the conductive path on the resonator.

15. The magnetic sensor as recited in claim 1, wherein the current is configured to be turned off periodically and a value of the magnetic field is reflected in a difference in a value in the control signal to maintain the MEMS device output constant with the current on and the current off.

16. A method of sensing a magnetic field using a MEMS device comprising:
supplying a current to at least one conductive path integral with a resonator of a resonating MEMS device to thereby exert a Lorentz force on the resonator in the presence of the magnetic field; and
determining the magnetic field based on a control value in a control loop used to maintain the MEMS device in resonance.

17. The method as recited in claim 16 further comprising generating the current supplied to the at least one conductive path based on a sensed output of the MEMS device.

18. The method as recited in claim 16 wherein at least a portion of the conductive path is oriented such that the current that flows through the portion is perpendicular to a direction of vibration of the resonator.

19. The method as recited in claim 16 wherein the apparent quality factor of the MEMS device is increased in the presence of the magnetic field exerting the Lorentz force on the resonator.

20. The method as recited in claim 16 further comprising generating an oscillator output signal using the MEMS device.

21. The method as recited in claim 20 further comprising:
generating the current as a current modulated at a frequency of the oscillator output signal; and
feeding the current back into the conductive path to supply the current.

22. The method as recited in claim 20 further comprising:
maintaining the oscillator output signal at a constant value using as the control loop an automatic gain control (AGC) loop; and
determining a value of the magnetic field according to a bias of the AGC loop used to maintain the constant value.

23. The method as recited in claim 16 further comprising:
calibrating the sensing of the magnetic field by generating a magnetic field using an inductor that is disposed in an integrated circuit with the MEMS device.

24. The method as recited in claim 16 further comprising concentrating an external magnetic field using magnetic concentration material in a cap forming a sealed environment for the MEMS device to generate the magnetic field.

25. The method as recited in claim 16 further comprising:
driving the resonator with at least one electrostatic input transducer; and
sensing vibration of the resonator with at least one electrostatic output transducer.

26. The method as recited in claim 16 further comprising the resonator vibrating in-plane in response to a first orientation of the magnetic field and vibrating out-of-plane in response to a second orientation of the magnetic field.

27. The method as recited in claim 16 further comprising sensing the magnetic field in three dimensions in the MEMS device.

28. The method as recited in claim 16 further comprising supplying a DC component to the current supplied to the conductive path to maintain a temperature of the resonator at a level that is substantially undisturbed by the supplied current.

29. The method as recited in claim 16 further comprising turning the current off and on and determining a value of the magnetic field by comparing a difference in the control value in the control loop to maintain the MEMS device output constant with the current on and the current off.

* * * * *